(12) United States Patent
Ikezaki (10) Patent No.: US 7,327,139 B2
(45) Date of Patent: Feb. 5, 2008

(54) PHASE CYCLING METHOD IN SSFP PULSE SEQUENCE AND MAGNETIC RESONANCE IMAGING APPARATUS

(75) Inventor: Yoshikazu Ikezaki, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 11/260,814

(22) Filed: Oct. 27, 2005

(65) Prior Publication Data

US 2006/0088083 A1 Apr. 27, 2006

(30) Foreign Application Priority Data

Oct. 27, 2004 (JP) ............................. 2004-312682

(51) Int. Cl.
*G01V 3/00* (2006.01)
(52) U.S. Cl. ...................................................... 324/307
(58) Field of Classification Search ................. 324/307
See application file for complete search history.

(56) References Cited

U.S. PATENT DOCUMENTS

| | | | |
|---|---|---|---|
| 4,973,906 A | 11/1990 | Bernstein | |
| 5,170,122 A | 12/1992 | Bernstein | |
| 5,251,628 A | 10/1993 | Foo | |
| 5,256,967 A | 10/1993 | Foo et al. | |
| 5,291,891 A | 3/1994 | Foo et al. | |
| 5,347,216 A | 9/1994 | Foo | |
| 5,545,992 A | 8/1996 | Foo | |
| 6,307,368 B1 * | 10/2001 | Vasanawala et al. | ........ 324/309 |
| 6,452,387 B1 * | 9/2002 | Hargreaves et al. | ........ 324/300 |
| 6,586,933 B1 | 7/2003 | Hardy et al. | |
| 6,608,479 B1 | 8/2003 | Dixon et al. | |
| 6,819,104 B2 * | 11/2004 | Yamazaki et al. | .......... 324/307 |
| 6,906,516 B2 * | 6/2005 | Bangerter et al. | .......... 324/309 |
| 6,922,054 B2 | 7/2005 | Hargreaves et al. | |
| 2003/0214293 A1 | 11/2003 | Dixon et al. | |
| 2004/0254446 A1 * | 12/2004 | Miller et al. | ................. 600/410 |

FOREIGN PATENT DOCUMENTS

JP 204-121466 4/2004

* cited by examiner

*Primary Examiner*—Brij Shrivastav
*Assistant Examiner*—Megann E Vaughn
(74) *Attorney, Agent, or Firm*—Armstrong Teasdale LLP

(57) ABSTRACT

In order to positively decrease the band artifact on the middle of image when the field ununiformity is relatively fair and Nex is small, the present invention provides a phase cycling method for use in SSFP pulse sequence of a gradient echo system for rolling back the phase shift of lateral magnetization developed in TR by the gradient field prior to the next RF excitation, by identifying the RF transmission phase developing the band artifact in the vicinity of zero amount of phase shift, namely the repetition of 0-0-0-0 (degrees) as unusable RF transmission phase to use a plurality of RF transmission phases other than the unusable RF transmission phase for the phase cycling.

15 Claims, 6 Drawing Sheets

FIG. 6B
G slice

FIG. 6C
G freq.

FIG. 6D
G phase

PHASE CYCLING METHOD IN SSFP PULSE SEQUENCE AND MAGNETIC RESONANCE IMAGING APPARATUS

CROSS REFERENCE TO RELATED APPLICATIONS

This application claims the benefit of Japanese Application No. 2004-312682 filed Oct. 27, 2004.

BACKGROUND OF THE INVENTION

The present invention relates to phase cycling method in the SSFP pulse sequence of the gradient echo system, in which the phase shift of lateral magnetization developed in the TR by the gradient magnetic field prior to the next RF excitation, as well as to a magnetic resonance imaging apparatus using the phase cycling method.

SSFP pulse sequence for the gradient echo system in which the phase shift of lateral magnetization developed in the TR by the gradient magnetic field is roll back prior to the next RF excitation is in general referred to as FISP (fast imaging with steady-state precession) or FIESTA (fast imaging employing steady state acquisition). FISP is susceptible to the ununiform field, and is known to tend to develop a band-like low signal region on the image, called Band Artifact. The RF transmission phase of generic FISP is repeatedly at 0-180-0-180 (degrees) for an excitation, which develops a steady state (SSFP: steady state free precession).

A known solution for solving the band artifact in the FISP is phase cycling method, described in the reference 1.

For example, when 2Nex (number of addition), an image is obtained at the RF transmission phases 0-0-0-0(degrees), then another image is obtained at the RF transmission phases 0-180-0-180(degrees) to combine those two images to decrease the band artifact. The increment of each of RF transmission phases is at 0 and 180 degrees.

In a similar manner, when 3Nex, images are obtained at three RF transmission phases of 0-0-0-0 (deg), 0-120-240-0-120-240 (deg), 0-240-120-0-240-120 (deg) to combine to decrease the band artifact. In this case, the increment of RF transmission phases is at 0, 120, and 240 degrees.

When 4Nex, 0-0-0-0 (deg), images are obtained at four RF transmission phases of 0-90-180-270 (deg), 0-180-0-180 (deg), 0-270-180-90 (deg) to combine to decrease the band artifact. The increment of RF transmission phases is at 0, 90, 180, and 270 degrees.

Figure 7A:
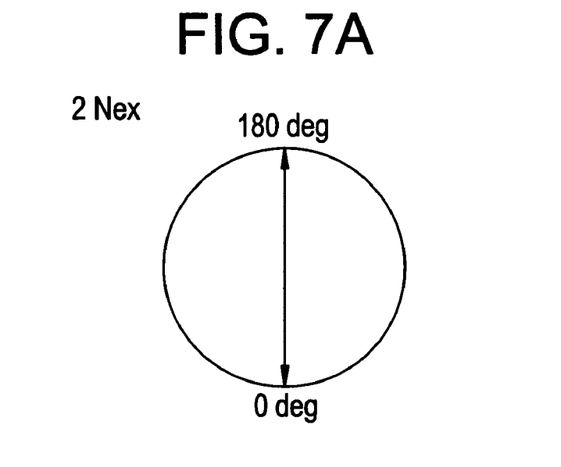
FIGS. 7a, 7b, and 7c are schematic diagrams of the increment of RF transmission phase for each excitation in the conventional phase cycling method drawn on two-dimensional plane.
Figure 7B:
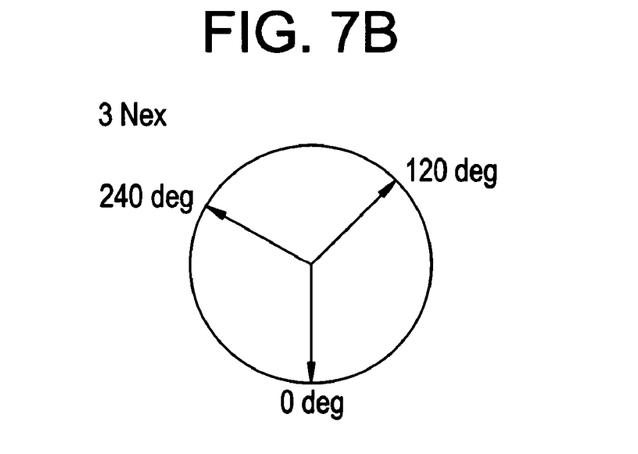
Figure 7C:
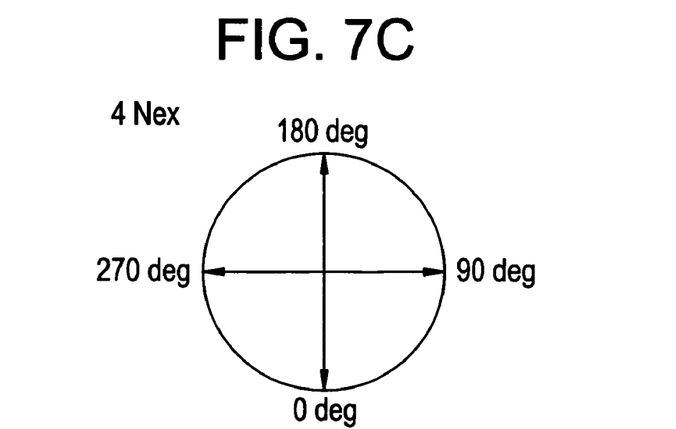

FIGS. 7a, 7b, and 7c show schematic diagrams of the increment of RF transmission phase for each excitation in the conventional phase cycling method drawn on two-dimensional plane. As shown in the figures, in the conventional phase cycling method, one cycle of 360 degrees is uniformly divided to determine the increment of RF transmission phases, depending on the number of addition (Nex). Sampling a plurality of times by shifted increment of RF transmission phases may shift the position of developed band artifact in a plurality of images obtained, and the combination of thus sampled images may result in a decrease of affected band artifact.

Reference 1: JP-A-2004-121466

However, in the conventional phase cycling method, when the ununiformity of magnetic field is relatively not severe and Nex is small, for example in 2Nex, a significant band artifact on the center of image is developed, resulting in the problem that the band artifact is not always sufficiently decreased.

SUMMARY OF THE INVENTION

Therefore, an object of the present invention is to provide a phase cycling method for SSFP pulse sequence and a magnetic resonance imaging apparatus, allowing the band artifact on the center of image to be positively decreased when the ununiformity of magnetic field is relatively satisfactory and Nex is small.

In order to solve the above cited problem to achieve the object, the phase cycling method for use in SSFP pulse sequence in the first aspect of the invention, in which phase shift of lateral magnetization developed in the TR by the gradient magnetic field is rolled back before the next RF excitation, is characterized in: identifying as unusable RF transmission phase the RF transmission phase developing a band artifact around the zero phase shift, based on the relationship between the RF transmission phase and the amount of phase shift developing the band artifact; and performing a phase cycling by using a plurality of RF transmission phase other than the unusable RF transmission phase.

In accordance with the present invention, The RF transmission phase which develops band artifact in the vicinity of zero amount of phase shift is identified as unusable RF transmission phase, so that the phase cycling is performed using a plurality of usable RF transmission phases, without using those unusable RF transmission phase, to positively decrease the band artifact developed in the vicinity of zero amount of phase shift (i.e., around the center of image).

The phase cycling method for use in SSFP pulse sequence in the second aspect of the invention is characterized in that at least one RF transmission phase among a plurality of RF transmission phases other than the unusable RF transmission phase uses the repetition of 0-180-0-180 (degrees) where the increment of transmission phase is 180 degrees. In accordance with the present invention, at least one of a plurality of RF transmission phases uses the RF transmission phase of 0-180-0-180 (degrees) where the signal intensity around the center of image is higher, so as to the decrease of band artifact in the vicinity of image center can be positively achieved.

The phase cycling method for use in SSFP pulse sequence in the third aspect of the invention is characterized in that the plurality of RF transmission phases has values that the increment of each transmission phase splits unequally two dimensional plane around 180 degrees of two dimensional plane. In accordance with the present invention, the increment of a plurality of RF transmission phases is such that the increment of each transmission phase takes a value that divides ununiformly two-dimensional plane on the center of 180 degrees of two dimensional plane to positively disperse the position of band artifact in the image obtained by each RF transmission phase.

In the phase cycling method for use in SSFP pulse sequence in accordance with fourth aspect of the invention, a plurality of RF transmission phases has each increment of transmission phase set in accordance with the following equation:

Phase=180 deg.; when n=1

Phase=2×180 deg.×(n−1)/N; when N is odd number

Phase=2×180 deg.×(n−1)/(N+1); when N is even number where N: number of Nex, n: index 1, 2, 3, . . . of Nex in Scan.

In the phase cycling method for use in SSFP pulse sequence in accordance with fifth aspect of the invention, if Nex (number of addition) of the phase cycling is even, then the plurality of RF transmission phases is composed by a pair of RF transmission phases with the increment of transmission phases in 180±☐ (where ☐ is a given number). In accordance with the present invention, a group consisted of pairs of RF transmission phases that the increment of transmission phase is in 180 degrees±☐ is used to positively disperse the position of band artifact in the image obtained by each RF transmission phase.

In the phase cycling method for use in SSFP pulse sequence in accordance with sixth aspect of the invention, the plurality of RF transmission phases has each increment of transmission phases set in accordance with the following equation:

Phase=2×180 deg.×(n+1)/(N+3); when N is even number where N: number of Nex, n: index 1, 2, 3, ... of Nex in Scan.

A magnetic resonance imaging apparatus in accordance with seventh aspect of the invention, which uses the phase cycling method for obtaining echo data in a plurality of views by setting the spin within the subject into SSFP status, is characterized by identifying as unusable RF transmission phase the RF transmission phase developing a band artifact around the zero phase shift, based on the relationship between the RF transmission phase and the amount of phase shift developing the band artifact; and performing a phase cycling by using a plurality of RF transmission phase other than the unusable RF transmission phase. In accordance with the present invention, the RF transmission phase which may develop band artifact in the vicinity of zero amount of phase shift is identified as unusable RF transmission phase so as to avoid using this unusable RF transmission phase and to use the plurality of any other RF transmission phases for the phase cycling in order to positively decrease the band artifact developed in the vicinity of zero amount of phase shift (i.e., around the center of image).

A magnetic resonance imaging apparatus in accordance with eighth aspect of the invention, which uses the phase cycling method for obtaining echo data in a plurality of views by setting the spin within the subject into SSFP status, is characterized by performing the phase cycling by using a plurality of RF transmission phases except for the repetition of 0-0-0-0 (degrees) where the increment of RF transmission phase is 0 degree. In accordance with the present invention, the RF transmission phase of 0-0-0-0 (deg) that develops a band artifact in the vicinity of zero amount of phase shift is not used while the plurality of any other RF transmission phases is used for the phase cycling in order to positively decrease the band artifact developed in the vicinity of zero amount of phase shift (i.e., around the center of image).

A magnetic resonance imaging apparatus in accordance with ninth aspect of the invention is characterized in that at least one RF transmission phase among a plurality of RF transmission phases other than the unusable RF transmission phase uses the repetition of 0-180-0-180 (degrees) where the increment of transmission phase is 180 degrees. In accordance with the present invention, at least one of a plurality of RF transmission phases uses the RF transmission phase of 0-180-0-180 (deg), which has higher signal intensity around the center of image in order to positively decrease the band artifact around the center of image.

A magnetic resonance imaging apparatus in accordance with tenth aspect of the invention is characterized in that the plurality of RF transmission phases has values that the increment of each transmission phase splits unequally two dimensional plane around 180 degrees of two dimensional plane. In accordance with the present invention, the increment of a plurality of RF transmission phases is such that the increment of each transmission phase takes a value that divides ununiformly two-dimensional plane on the center of 180 degrees of two dimensional plane to positively disperse the position of band artifact in the image obtained by each RF transmission phase.

A magnetic resonance imaging apparatus in accordance with eleventh aspect of the invention is characterized in that the plurality of RF transmission phases has each increment of transmission phases set in accordance with the following equation:

Phase=180 deg.; when n=1

Phase=2×180 deg.×(n−1)/N; when N is odd number

Phase=2×180 deg.×(n−1)/(N+1); when N is even number where N: number of Nex, n: index 1, 2, 3, ... of Nex in Scan.

A magnetic resonance imaging apparatus in accordance with twelfth aspect of the invention is characterized in that if Nex (number of addition) of the phase cycling is even, then the plurality of RF transmission phases is composed by a pair of RF transmission phases with the increment of transmission phases in 180±α (where α is a given number). In accordance with the present invention, a group consisted of pairs of RF transmission phases that the increment of transmission phase is in 180 degrees±α is used to positively disperse the position of band artifact in the image obtained by each RF transmission phase.

A magnetic resonance imaging apparatus in accordance with thirteenth aspect of the invention is characterized in that the plurality of RF transmission phases has each increment of transmission phases set in accordance with the following equation:

Phase=2×180 deg.×(n+1)/(N+3); when N is even number where N: number of Nex, n: index 1, 2, 3, ... of Nex in Scan.

The phase cycling method for use in the SSFP pulse sequence and the magnetic resonance imaging apparatus in accordance with the present invention identifies the RF transmission phase which develops the band artifact in the vicinity of zero amount of phase shift, more specifically 0-0-0-0 (deg) as unusable RF transmission phase so as not to use this unusable RF transmission phase, while using a plurality of any other RF transmission phases for the phase cycling, thereby the present invention may provide the phase cycling method for use in the SSFP pulse sequence and the magnetic resonance imaging apparatus, which allow the band artifact in the vicinity of the center of image to positively decrease when the ununiformity of magnetic field is relatively satisfactory and Nex is small.

The phase cycling method in SSFP pulse sequence and the magnetic resonance imaging apparatus in accordance with the present invention is especially suitable to the case in which the static field ununiformity is relatively satisfactory in the FOV (field of view) and Nex is smaller such as the examination of head.

Further objects and advantages of the present invention will be apparent from the following description of the preferred embodiments of the invention as illustrated in the accompanying drawings.

DETAILED DESCRIPTION OF THE INVENTION

An embodiment of the phase cycling method for use in the SSFP pulse sequence and the magnetic resonance imaging apparatus in accordance with the present invention will be described in greater details with reference to the accompanying drawings. It should be noted that the present invention is not to be limited to the presented embodiment.

Prior to describing the embodiment, principal concept of the phase cycling method in accordance with the present invention will be described. The present invention is characterized by identifying as unusable RF transmission phase the RF transmission phase developing a band artifact around the zero phase shift, based on the relationship between the RF transmission phase and the amount of phase shift developing the band artifact, and performing a phase cycling by using a plurality of RF transmission phase other than the unusable RF transmission phase.

Equation (1) is well known equation of signal intensity for FISP. S designates to the signal intensity, TR to the repetition time, T1 and T2 to relaxation times.

$$S = M0(1-E1)E2 \sin A/(1-E1E2-\cos A(E1-E2)) \quad (1)$$

where $E1=\exp\{-TR/T1\}$, and $E2=\exp\{-TR/T2\}$.

Now we develop the well-known equation of signal intensity for FISP as shown EQ (1) in the following conditions. Now define Z-axis as the main field direction; define Flip Angle as A by taking the PF in x-axis direction into consideration; define as B the amount of phase shift developed in the lateral magnetization within TR, caused by for example ununiformity of static field. Then by solving the Bloch equation in the rotative coordinate system, lateral magnetization mySSFP and mxSSFP in the steady state, lateral magnetization myFID and mxFID of the FID immediately after excitation can be given as follows:

$$mySSFP = M0(1-E1)(E2 \sin A \cos B + E2E2 \sin A)/(C3-C4) \quad (2)a$$

$$mxSSFP = M0(1-E1)E2 \sin A \sin B/(C3-C4) \quad (2)b$$

$$myFID = -M0(1-E1)(1+E2 \cos B)\sin A/(C3-C4) \quad (2)c$$

$$mxFID = mxSSFP \quad (2)d$$

where $C3=(1-E1 \cos A)(1+E2 \cos B)$, and
$C4=E2(E1-\cos A)(E2+\cos B)$.

Above equation (2) is the FISP signal intensity equation with the phase shift developed to the lateral magnetization being taken into consideration. Taking B=0 in the above equation (2)a may result in the well-known FISP signal intensity equation (1).

Figure 1:
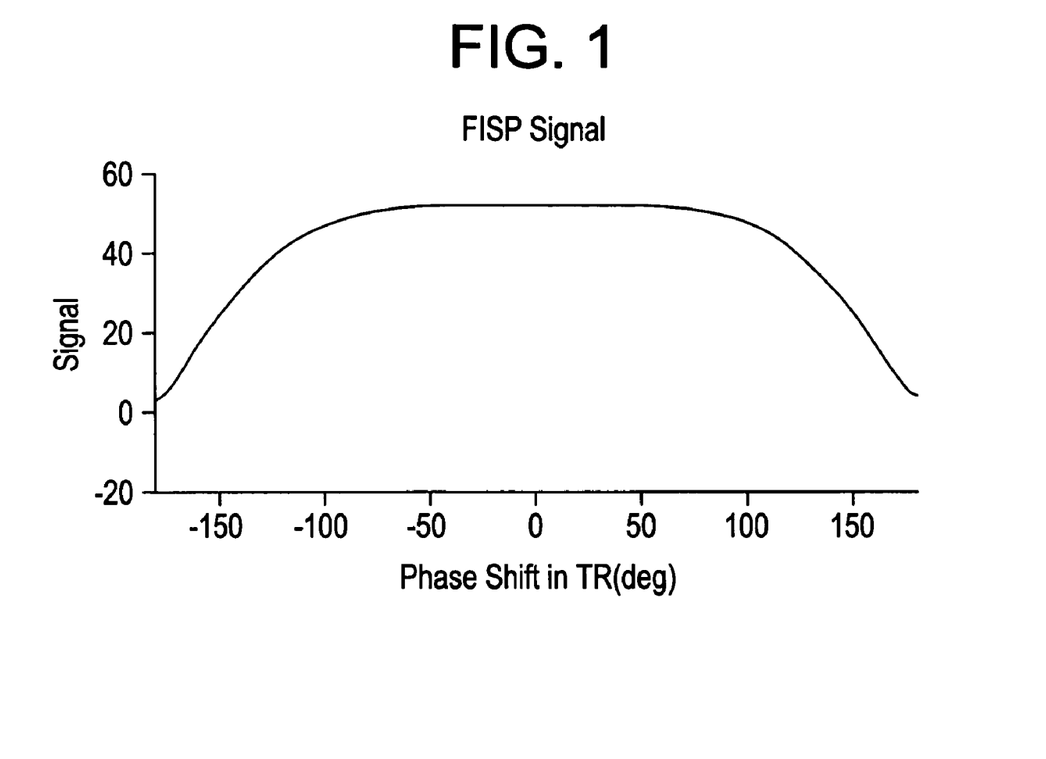
FIG. 1 shows a schematic diagram illustrating the principal of the present invention, indicating the signal intensity with respect to the amount of phase shift in FISP.

FIG. 1 shows the signal intensity with respect to the amount of phase shift in the FISP. In the figure, the signal intensity with respect to the amount of phase shift B when the relaxation time T1=T2=300 ms, TR=20 ms, and A=90 degrees. In the figure, where the signal intensity is decreased in the region of high absolute value of the phase shift indicates the band artifact. Note that the equation (2) is the result of RF transmission phase solved as the repetition of 0-180-0-180 (degrees), which is generic transmission phase of FISP. In the following description, the repetition of RF transmission phases will be simply described such as 0-180-0-180 (degrees).

As can be clearly seen from FIG. 1, when the RF transmission phase is 0-180-0-180 (degrees), i.e., the increment of RF transmission phases is at 180 degrees, then the signal intensity is higher in the vicinity of zero amount of phase shift (corresponds to the vicinity of center of image), and the band artifact may develop where the absolute value of phase shift is more than 100 (in the periphery of image).

Next, when there is no increment of RF transmission phase, the equation of signal intensity of FISP for 0-0-0-0 (degrees) may be similarly given as equation (3):

$$mySSFP = -M0(1-E1)(E2 \sin A \cos B - E2E2 \sin A)/(C1-C2) \quad (3)a$$

$$mxSSFP = -M0(1-E1)E2 \sin A \sin B/(C1-C2) \quad (3)b$$

$$myFID = -M0(1-E1)(1-E2 \cos B)\sin A/(C1-C2) \quad (3)c$$

$$mxFID = mxSSFP \quad (3)d$$

where $C1=(1-E1 \cos A)(1-E2 \cos B)$, and
$C2=E2(E1-\cos A)(E2-\cos B)$.

Figure 2:
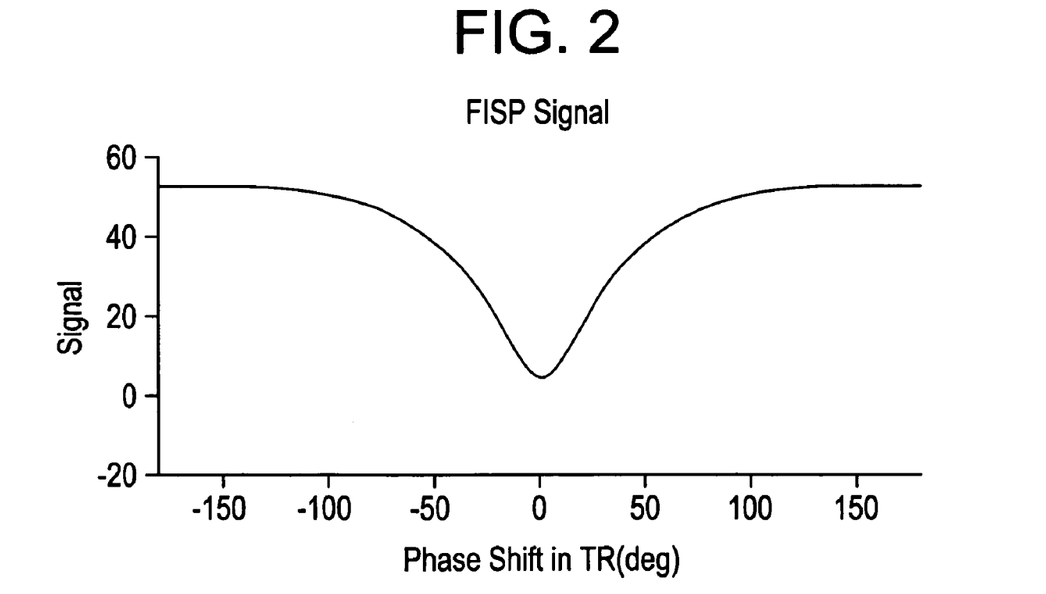
FIG. 2 shows a schematic diagram illustrating the principal of the present invention, indicating the signal intensity with respect to the amount of phase shift in FISP when 0-0-0-0 (degrees)

FIG. 2 shows the signal intensity in FISP with respect to the amount of phase shift when 0-0-0-0 (degrees). In the figure, it can be seen that the band artifact is present in the center of image, where the amount B of phase shift is at or near zero, i.e., where the uniformity is relatively satisfactory.

The amount of phase shift that affects the lateral magnetization in TR is the same as the increment of the RF transmission phase for each excitation in the phase cycling. This is because in the phase cycling method RF transmission phase is varied while at the same time the reception phase is also tuned thereto, these two phases are equal when taking in a rotational coordinate system. The conventional phase cycling method attempts to vary the position of band artifact to combine images each having band artifact at different position to decrease the band artifact. In other words, the conventional method considered solely shifting the position of band artifact, however it did not consider the developed position of band artifact.

In the conventional phase cycling method, now, significant band artifact is developed on the center of image when the ununiformity of field is relatively satisfactory and Nex is small for example 2Nex, resulting in the problem that the band artifact is not always sufficiently decreased.

The inventor of the present invention considers the results of FIGS. 1 and 2, and approaches the fact that the conventional phase cycling method attempts solely to shift the band artifact, to conclude that there are three causes of the problem seen in the conventional phase cycling method (development of band artifact when the field ununiformity is relatively fair and Nex is small): 1) the conventional phase cycling method acquires always data at the zero phase transmission 0-0-0-0(degrees); 2) the contribution of data at 0-0-0-0 (degrees) in the composite image increases when Nex is small; and 3) the developed position of band artifact is not considered.

The phase cycling method in accordance with the present invention therefore identifies the RF transmission phase at 0-0-0-0 (degrees) which develops the band artifact in the vicinity of zero amount of phase shift as unusable RF transmission phase, based on the relationship between the RF transmission phase determined by the equation (2) and the amount of phase shift that develops the band artifact, to use a plurality of RF transmission phases other than 0-0-0-0 (degrees) for the phase cycling.

At this point, at least one RF transmission phase among a plurality of RF transmission phases uses the repetition of 0-180-0-180 (degrees) where the increment of transmission phase is at 180 degrees. As shown in FIG. 1, the RF transmission phase of 0-180-0-180 (degrees) has a high signal intensity in the vicinity of zero amount of phase shift (corresponding to the center of image), and the band artifact develops in the periphery of image, this RF transmission phase will be then the most effective in decreasing the band artifact.

In addition, the increment of RF transmission phases that divides uniformly two dimensional plane in the conventional phase cycling method is set so as to be the value that two dimensional plane is ununiformly divided about 180 degrees of two dimensional plane in the phase cycling method in accordance with the present invention.

The increment of RF transmission phase of the prior art may be expressed as equation (4), while the increment of the RF transmission phase in accordance with the present invention may be given as an example as equation (5) below.

$$\text{Phase}=2\times180 \text{ deg.}\times(n-1)/N \tag{4}$$

where N: number of Nex, n: index 1, 2, 3, . . . of Nex in Scan.

$$\text{Phase}=180 \text{ deg.; when } n=1$$

$$\text{Phase}=2\times180 \text{ deg.}\times(n-1)/N; \text{ when N is odd number}$$

$$\text{Phase}=2\times180 \text{ deg.}\times(n-1)/(N+1); \text{ when N is even number} \tag{5}$$

Practically, the increment of RF transmission phase in accordance with the present invention can be compared with that of conventional method as follows:

Nex=2, prior art: 0, 180
  present invention: 180, 120
Nex=3, prior art: 0, 120, 240
  present invention: 180, 120, 240
Nex=4, prior art: 0, 90, 180, 270
  present invention: 180, 72, 144, 216
Nex=5, prior art: 0, 72, 144, 216, 288
  present invention: 180, 72, 144, 216, 288

Figure 3A:
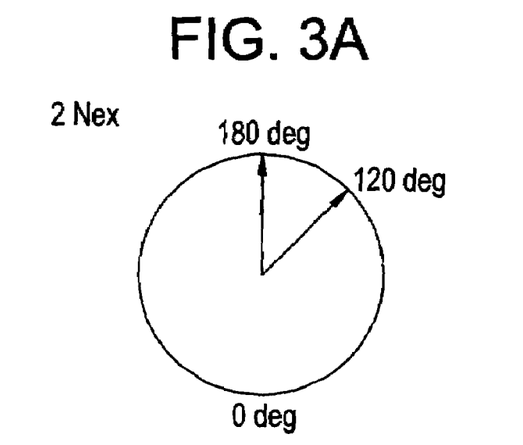
FIGS. 3a, 3b, and 3c are schematic diagrams illustrating the increment of RF transmission phase for each excitation in the phase cycling method in accordance with the present invention drawn on two-dimensional plane.
Figure 3B:
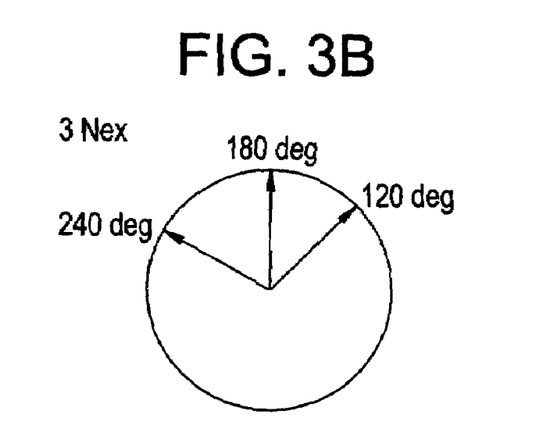
Figure 3C:
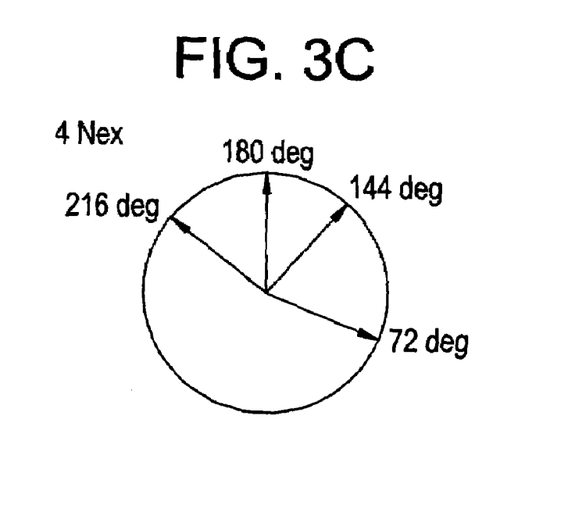
Figure 4:
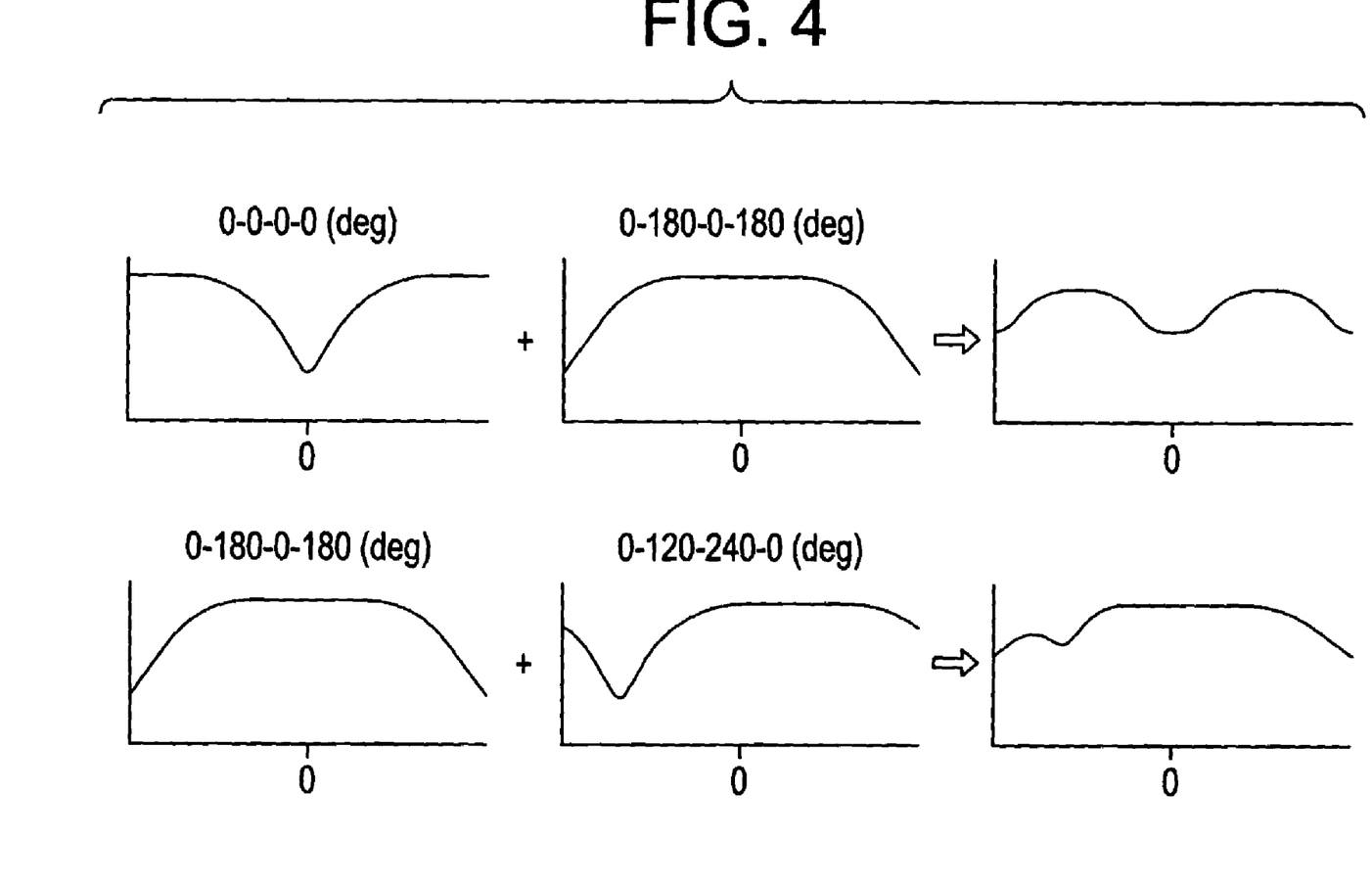
FIGS. 4a, 4b, 4c, 4d, 4e, and 4f are schematic diagrams indicative of the comparison between the signal intensity of a composite image in accordance with the present invention and the signal intensity of a composite image in accordance with the prior art.

FIGS. 3a, 3b, and 3c show schematic diagrams of the increment of RF transmission phase for each excitation in the phase cycling method in accordance with the present invention drawn on two-dimensional plane. Since the phase cycling is performed around the transmission phase of 180 degrees, images are composed based on an image that is unlikely to have the band artifact in the center of image with those having gradually shifted band artifact. In this manner, the band artifact is not likely to be seen with small Nex.

Now referring to FIGS. 4a, 4b, 4c, 4d, 4e, and 4f, which compare the signal intensity of a composite image in accordance with the present invention with the signal intensity of composite image in accordance with the prior art, the decrease of band artifact in the center of image, as an example, in case of 2Nex in practice, will be described. In the prior art the RF transmission phase 0-0-0-0 (degrees) is used which has low signal intensity in the center region of image (around zero phase shift), and this RF transmission phase 0-0-0-0 (degrees) is added to another RF transmission phase 0-180-0-180 (degrees) to generate a composite image. In the composite image, therefore the low signal intensity region is developed around the zero phase shift (development of band artifact).

On the other hand, the present invention uses the RF transmission phase 0-180-0-180 (degrees), which has strong signal intensity around the zero phase shift (corresponding to the center region of image) and weak signal intensity in the peripheral region of image, to add to the RF transmission phase 0-120-240-0 (degrees), which has similarly strong signal intensity around the zero phase shift (corresponding to the center region of image) and weak signal intensity out of the center region of image to generate a composite image. In this manner, the low signal intensity region (development of band artifact) is not developed around the zero phase shift region in the composite image. In other words, the band artifact around the center region of image can be positively decreased even when the field ununiformity is relatively fair and Nex is small.

In the foregoing description, an example has been shown which uses at least one 0-180-0-180 (degrees) for the RF transmission phase. When the Nex (number of addition) in phase cycling is even, the plurality of RF transmission phases may be made of a group of pairs of RF transmission phases having a relationship that the increment of transmission phase is in 180±α (α is a given number). In the example shown as equation (5), data of 180 degrees increment of the RF transmission phase is always acquired even if Nex is even number, however as shown in equation (6) data can be symmetrically placed around 180 degrees, such as Nex=2: 144, 216, and Nex=4: 103, 154, 206, 257 (degrees). By setting the RF transmission phases as such, the band artifact around the center of image can be positively decreased when the field ununiformity is relatively satisfactory and Nex is small.

$$\text{Phase}=2\times180 \text{ degrees}\times(n+1)/(N+3); \text{ when N is even number} \tag{6}$$

Figure 5:
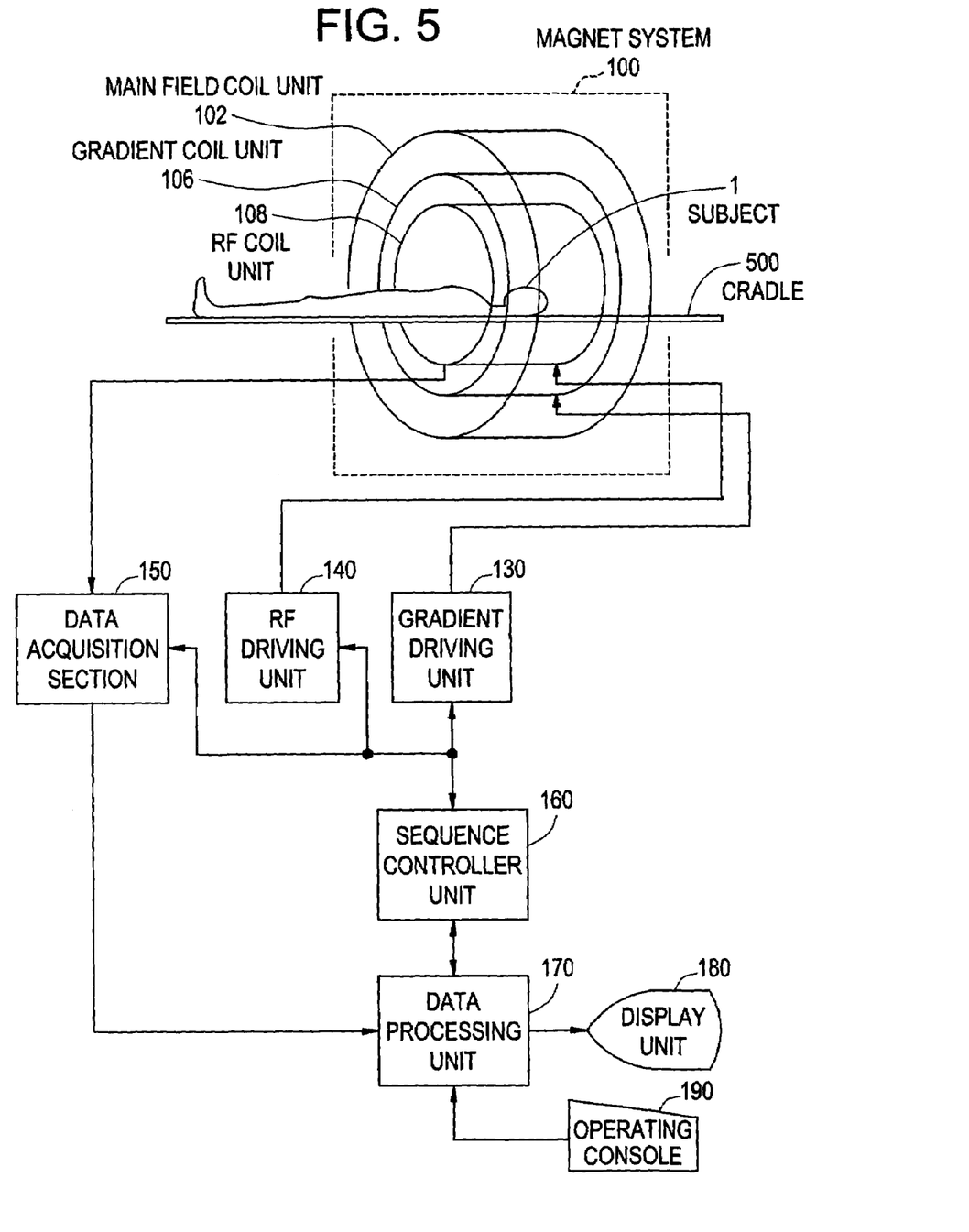
FIG. 5 shows a schematic block diagram of a magnetic resonance imaging apparatus in accordance with the preferred embodiment of the present invention.

Next, an exemplary embodiment of magnetic resonance imaging apparatus with the foregoing phase cycling method applied in accordance with the present invention will be described. FIG. 5 shows a schematic block diagram of the magnetic resonance imaging apparatus in accordance with the embodiment of the present invention. The apparatus is an exemplary embodiment. The arrangement of the apparatus illustrates an exemplary embodiment with respect to the apparatus in accordance with the present invention.

As shown in the figure, the apparatus includes a magnet system 100. The magnet system 100 has a main field coil unit 102, gradient coil unit 106, and RF coil unit 108. These coil units are roughly in the form of cylinder, and are coaxially placed. The subject to be imaged mounted on a cradle 500 will be carried in and out of the bore roughly in the form of cylinder of the magnet system 100, by a carrier means not shown in the figure.

The main field coil unit 102 creates a static field in the bore of the magnet system 100. The direction of static field is approximately parallel to the body axis of the subject 1. In other words, it forms a horizontal field. The main field coil unit 102 may be formed of for example a superconductor coil.

The gradient coil unit 106 creates three gradient fields, in the directions of three axis, namely slice axis, phase axis and frequency axis, perpendicular each to other, for making gradient to the static field intensity. When defining the mutually perpendicular axis of coordinates in the static field space as X, Y, and Z, any axis can be the slice axis. In that case, one of remaining two axes is the phase axis and the other is frequency axis. The slice, phase, and frequency axis can be inclined to a given degrees with respect to X-, Y-, and Z-axes, provided that mutual perpendicular relationship is held. In the apparatus of the present invention, Z-axis is defined as the body axis of the subject 1.

The gradient field in the direction of slice axis is defined as slice gradient field. The gradient field in the direction of phase axis is defined as phase encode gradient field. The gradient field in the direction of frequency axis is defined as read out gradient field. The read out gradient field is the synonym of frequency encode gradient field. To achieve the generation of such gradient fields, the gradient coil unit 106 incorporates three gradient coil systems not shown in the figure. The gradient field may also be referred to as simply gradient.

The RF coil unit 108 creates a high frequency field for exciting the spin within the body of subject 1 in the static field. In the description which follows, creation of high frequency field is also referred to as transmission of RF excitation signal. The RF excitation signal is also referred to as RF pulse. The electromagnetic wave developed by the excited spin, namely the magnetic resonance signal is received by the RF coil unit 108.

Magnetic resonance signal is the signal of frequency domain, i.e., signal of Fourier space. The gradient in the direction of phase axis as well as in the direction of frequency axis encodes the magnetic resonance signal in two axial directions, and the signal will be obtained as signal in two dimensional Fourier space. The phase encode gradient and the read out gradient will determine the sampling position of signal in the two dimensional Fourier space.

A gradient driving unit 130 is connected to the gradient coil unit 106. The gradient driving unit 130 provides driving signal to the gradient coil unit 106 to generate gradient fields. The gradient driving unit 130 has three driving circuits not shown in the figure, each corresponding to three gradient coil systems in the gradient coil unit 106.

An RF driving unit 140 is connected to the RF coil unit 108. The RF driving unit 140 provides driving signal to the RF coil unit 108 to transmit RF pulses to excite the spin within the body of subject 1. A data acquisition unit 150 is also connected to the RF coil unit 108. The data acquisition unit 150 will collect the receiving signal received by the RF coil unit 108 as digital data.

The gradient driving unit 130, RF driving unit 140, and data acquisition unit 150 are connected to a sequence controller unit 160. The sequence controller unit 160 controls the gradient driving unit 130 as well as the data acquisition unit 150 to execute the acquisition of magnetic resonance signal.

The sequence controller unit 160 may be composed of for example a computer. The sequence controller unit 160 has a memory but not shown in the figure. The memory stores the program and various data for use in the sequence controller unit 160. The capability of the sequence controller unit 160 may be achieved by the computer executing the program stored in the memory.

The output node of the data acquisition unit 150 is connected to a data processing unit 170. The data collected by the data acquisition unit 150 is fed to the data processing unit 170. The data processing unit 170 may be formed of for example a computer. The data processing unit 170 has a memory but not shown in the figure. The memory stores the program and various data for use in the data processing unit 170.

The data processing unit 170 is connected to the sequence controller unit 160. The data processing unit 170 is superior to and manages the sequence controller unit 160. The capability of the apparatus may be achieved by the data processing unit 170 executing the program stored in the memory.

The data processing unit 170 stores the data collected by the data acquisition unit 150 into the memory. A data space is formed in the memory. The data space may correspond to two-dimensional Fourier space (k-space). The data processing unit 170 may perform two-dimensional invert Fourier transformation on the data in the k-space to reconstruct an image.

The data processing unit 170 is connected to a display unit 180 and an operating console 190. The display unit 180 may be formed of for example a graphic display device and the like. The operating console 190 may be formed of for example a keyboard equipped with a pointing device and the like.

The display unit 180 may display the reconstructed image and various information supplied from the data processing unit 170. The operating console 190 may be operated by a user to help inputting any command instructions and information into the data processing unit 170. The user may interact the apparatus through the display unit 180 and the operating console 190.

Figure 6A:
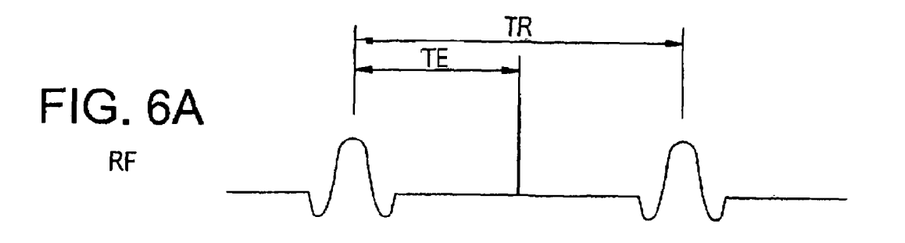
FIGS. 6a, 6b, 6c, and 6d are schematic block diagrams illustrating a scan pulse sequence in SSFP status.
Figure 6B:
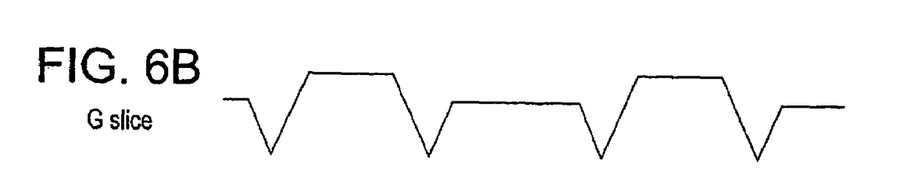
Figure 6C:
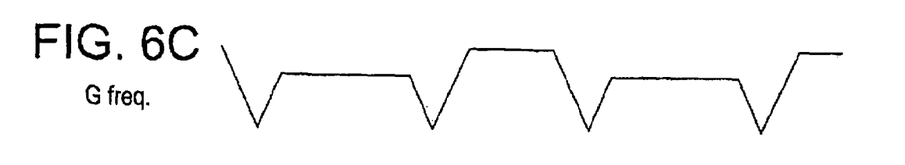
Figure 6D:
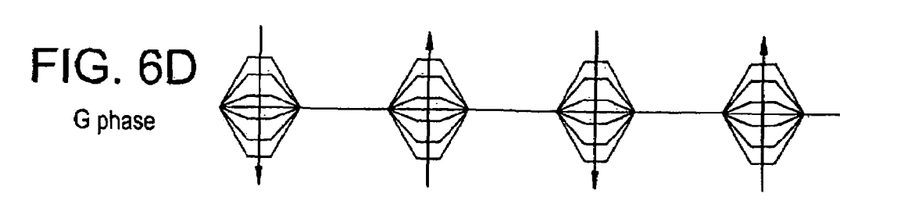

FIGS. 6a, 6b, 6c, and 6d show pulse sequences of a scan in the SSFP status. The pulse sequences proceed from left hand to right hand. FIG. 6a indicates the pulse sequence of RF signal. FIGS. 6b, 6c, and 6 indicate the pulse sequences of gradient fields. FIG. 6b is the slice gradient, FIG. 6c is the frequency encode gradient, and FIG. 6d is the phase encode gradient. It should be noted here that the static field is always applied at a constant intensity of magnetic field.

As shown in the figures, spin excitation by $\alpha°$ pulses. The spin excitation is a selective excitation under the slice gradient Gslice. The spin excitation is iteratively repeated at a cycling interval TR. The cycle TR may also be referred to as pulse repetition time. 1TR corresponds to one view.

Frequency encode gradient Gfreq applied during 1TR will read out the echo. The echo may be expressed as its center signal. The time span from the center of $\alpha°$ pulse to the center of echo is defined as echo time TE. The echo time may also be simply described as TE hereinbelow.

In general, frequency encode gradient may be set such that TE=TR/2. When imaging water and lipid separately, TE may be set to 1/m of the time where the phase difference between water and lipid may be $2\pi$. This can be done by the setting of TR. 'm' may be 4 for example. The phase difference from water to lipid will be $\pi/2$ in that case. 'm' may not be limited to 4.

During 1TR, phase encode gradient Gphase is applied immediately after a spin excitation and immediately before the next spin excitation, respectively. The pair of phase encode gradient Gphase is mutually symmetric in the amplitude and polarity. The former phase encode gradient Gphase will roll up the phase encode, then the latter phase encode gradient Gphase will roll back the phase encode. The amount of phase encode may be changed for each 1TR.

Echo is read out by the phase encode and frequency encode to sample the data in k-space. The amount of phase encode is 0 at the center of phase axis ky. The amount of phase encode gradually increases from the center to both sides. The polarity of increase is mutually in opposition.

In the apparatus of the present invention, for the phase cycling for data acquisition as have been described above, as shown in the phase cycling in accordance with the present invention, with respect to the phase of $\alpha°$ pulse (namely the RF transmission phase), the RF transmission phase of 0-0-0-0 (degrees) is identified as unusable RF transmission phase, which develops the band artifact around the zero amount of phase shift, and a plurality of RF transmission phases other than 0-0-0-0 (degrees) are used for the phase cycling. More specifically, at least one RF transmission phase amount the plurality of RF transmission phases is used at 0-180-0-180 (degrees) where the increment of transmission phase is at 180 degrees.

When the ununiformity of static field in the FOV (field of view) is relatively satisfactory in such a case as the examination of head, if there is seen one band artifact or two in the FOV with FISP that does not perform the phase cycling, the prior art FISP with the phase cycling requires a larger Nex, at least 4Nex or more for removing the band artifact, and if a smaller Nex is applied such as 2Nex and so in the scan, the band artifact is always appeared on the middle of the image. The apparatus in accordance with the present invention, however, may use a smaller Nex such as 2Nex, indicative of shorter scan time, for obtaining a better image that has not a band artifact.

Many widely different embodiments of the invention may be configured without departing from the spirit and the scope of the present invention. It should be understood that the present invention is not limited to the specific embodiments described in the specification, except as defined in the appended claims.

The invention claimed is:

1. A phase cycling method for use in SSFP pulse sequence for a gradient echo system in which phase shift of lateral magnetization developed in a TR by a gradient magnetic field is rolled back before the next RF excitation, said method comprising the steps of:
   identifying as unusable RF transmission phase a RF transmission phase developing a band artifact around a zero phase shift, based on a relationship between the RF transmission phase and an amount of phase shift developing the band artifact; and
   performing a phase cycling by excluding acquisition of data at said unusable RF transmission phase and by using a plurality of RF transmission phases other than said unusable RF transmission phase, wherein said plurality of RF transmission phases has values that an increment of each transmission phase splits unequally in a two-dimensional plane around 180 degrees of the two-dimensional plane.

2. A phase cycling method for use in SSFP pulse sequence, according to claim 1, in which:
   at least one RF transmission phase among a plurality of RF transmission phases other than said unusable RF transmission phase uses the repetition of 0-180-0-180 (degrees) where the increment of transmission phase is 180 degrees.

3. A phase cycling method for use in SSFP pulse sequence, according to claim 1, in which:
   said plurality of RF transmission phases has each increment of transmission phase set in accordance with the following equation:

Phase=180 deg. ; when n=1

Phase=2×180 deg.×($n$−1)/N; when N is odd number

Phase=2×180 deg.×($n$−1)/($N$+1); when N is even number where N: number of Ncx, n: index 1, 2, 3, . . . of Nex in Scan.

4. A phase cycling method for use in SSFP pulse sequence, according to claim 1, in which:
   if Nex (number of addition) of said phase cycling is even, then said plurality of RF transmission phases is composed by a pair of RF transmission phases with the increment of transmission phases in 180±a (where a is a given number).

5. A phase cycling method for use in SSFP pulse sequence, according to claim 4, in which:
   said plurality of RF transmission phases has each increment of transmission phases set in accordance with the following equation:

Phase=2×180 deg.×($n$+1)/($N$+3); when N is even number where N: number of Nex, n: index 1, 2, 3, . . . of Nex in Scan.

6. A magnetic resonance imaging apparatus that uses a phase cycling method for obtaining echo data in a plurality of views by setting a spin within a subject into SSFP status, said apparatus comprising a data processing unit configured to:
   identify as unusable RF transmission phase a RF transmission phase developing a band artifact around a zero phase shift, based on a relationship between the RF transmission phase and an amount of phase shift developing the band artifact; and
   perform a phase cycling by excluding acquisition of data at said unusable RF transmission phase and by using a plurality of RF transmission phase phases other than said unusable RF transmission phase, wherein said plurality of RF transmission phases has values that an increment of each transmission phase splits unequally in a two-dimensional plane around 180 degrees of the two-dimensional plane.

7. A magnetic resonance imaging apparatus according to claim 6, in which:
   at least one RF transmission phase among a plurality of RF transmission phases uses the repetition of 0-180-0-180 (degrees) where the increment of transmission phase is 180 degrees.

8. A magnetic resonance imaging apparatus according to claim 6, in which:
   said plurality of RF transmission phases has each increment of transmission phases set in accordance with the following equation:

Phase=180 deg. ; when n=1

Phase=2×180 deg.×($n$−1); when N is odd number

Phase=2×180 deg.×($n$−1)/($N$+1); when N is even number where N: number of Nex, n: index 1, 2, 3, . . . of Nex in Scan.

9. A magnetic resonance imaging apparatus according to claim 6, in which:

if Nex (number of addition) of said phase cycling is even, then said plurality of RF transmission phases is composed by a pair of RF transmission phases with the increment of transmission phases in 180±a (where a is a given number).

10. A magnetic resonance imaging apparatus according to claim 9, in which:

said plurality of RF transmission phases has each increment of transmission phases set in accordance with the following equation:

Phase=2×180 deg.×$(n+1)/(N+3)$; when N is even number where N: number of Nex, n: index 1, 2, 3, . . . of Nex in Scan.

11. A magnetic resonance imaging apparatus that uses a phase cycling method for obtaining echo data in a plurality of views by setting a spin within a subject into SSFP status, said apparatus comprising a data processing unit configured to:

perform the phase cycling by using a plurality of RF transmission phases except for a repetition of 0-0-0-0 (degrees) where an increment of RF transmission phase is 0 degree, and said plurality of RF transmission phases has values that the increment of each transmission phase splits unequally in a two-dimensional plane around 180 degrees of the two-dimensional plane.

12. A magnetic resonance imaging apparatus according to claim 11 in which:

at least one RF transmission phase among a plurality of RF transmission phases uses the repetition of 0-180-0-180 (degrees) where the increment of transmission phase is 180 degrees.

13. A magnetic resonance imaging apparatus according to claim 11, in which:

said plurality of RF transmission phases has each increment of transmission phases set in accordance with the following equation:

Phase=180 deg. ; when n=1

Phase=2×180 deg.×$(n-1)/N$; when N is odd number

Phase=2×180 deg.×$(n-1)/(N+1)$; when N is even number where N: number of Nex, n: index 1, 2, 3, . . . of Nex in Scan.

14. A magnetic resonance imaging apparatus according to claim 11 in which:

if Nex (number of addition) of said phase cycling is even, then said plurality of RF transmission phases is composed by a pair of RF transmission phases with the increment of transmission phases in 180±a (where a is a given number).

15. A magnetic resonance imaging apparatus according to claim 14, in which:

said plurality of RF transmission phases has each increment of transmission phases set in accordance with the following equation:

Phase=2×180 deg.×$(n+1)/(N+3)$; when N is even number where N: number of Nex, n: index 1, 2, 3, . . . of Nex in Scan.

* * * * *